United States Patent
Yu et al.

(10) Patent No.: US 10,608,641 B2
(45) Date of Patent: Mar. 31, 2020

(54) HIERARCHICAL PARTIAL RECONFIGURATION FOR PROGRAMMABLE INTEGRATED CIRCUITS

(71) Applicant: Xilinx, Inc., San Jose, CA (US)

(72) Inventors: Hao Yu, Broomfield, CO (US);
Raymond Kong, San Jose, CA (US);
Brian S. Martin, Longmont, CO (US);
Jun Liu, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/041,602

(22) Filed: Jul. 20, 2018

(65) Prior Publication Data
US 2020/0028511 A1   Jan. 23, 2020

(51) Int. Cl.
| | | |
|---|---|---|
| *G06F 17/50* | (2006.01) | |
| *G06F 15/78* | (2006.01) | |
| *H03K 19/17756* | (2020.01) | |
| *H03K 19/1776* | (2020.01) | |
| *H03K 19/17736* | (2020.01) | |
| *H03K 19/17728* | (2020.01) | |
| *H03K 19/177* | (2006.01) | |

(52) U.S. Cl.
CPC ... *H03K 19/17756* (2013.01); *G06F 17/5054* (2013.01); *H03K 19/1776* (2013.01); *H03K 19/17728* (2013.01); *H03K 19/17744* (2013.01); *G06F 15/7867* (2013.01)

(58) Field of Classification Search
None
See application file for complete search history.

(56) References Cited

U.S. PATENT DOCUMENTS

| | | |
|---|---|---|
| 6,507,211 B1 | 1/2003 | Schultz et al. |
| 6,525,562 B1 | 2/2003 | Schultz et al. |
| 6,526,557 B1 | 2/2003 | Young et al. |
| 6,573,748 B1 | 6/2003 | Trimberger |
| 6,625,794 B1 | 9/2003 | Trimberger |
| 6,678,646 B1 * | 1/2004 | McConnell ......... G06F 17/5068 703/22 |

(Continued)

OTHER PUBLICATIONS

U.S. Appl. No. 15/889,074, filed Feb. 5, 2018, Yu et al., San Jose, CA USA.

(Continued)

*Primary Examiner* — Minh D A
*Assistant Examiner* — James H Cho
(74) *Attorney, Agent, or Firm* — Cuenot, Forsythe & Kim, LLC

(57) ABSTRACT

Hierarchical partial reconfiguration for integrated circuits includes converting, using computer hardware, a first partial reconfiguration module of a circuit design into a first partial reconfiguration container, wherein the circuit design is placed and routed, loading, using the computer hardware, a first netlist into the first partial reconfiguration container, wherein the first netlist includes a first plurality of partial reconfiguration modules that are initially empty, and including, using the computer hardware, a further netlist within each of the first plurality of partial reconfiguration modules. Using the computer hardware, the first partial reconfiguration container is implemented with the first plurality of partial reconfiguration modules being implemented within the first partial reconfiguration container.

7 Claims, 12 Drawing Sheets

(56) References Cited

U.S. PATENT DOCUMENTS

| | | | |
|---|---|---|---|
| 6,907,595 B2 | 6/2005 | Curd et al. | |
| 7,109,750 B2 | 9/2006 | Vadi et al. | |
| 7,138,820 B2 | 11/2006 | Goetting et al. | |
| 7,218,137 B2 | 5/2007 | Vadi et al. | |
| 7,233,532 B2 | 6/2007 | Vadi et al. | |
| 7,235,999 B2 | 6/2007 | Goetting et al. | |
| 7,599,299 B2 | 10/2009 | Goetting et al. | |
| 7,640,526 B1 * | 12/2009 | Blodget | G06F 17/5054 703/22 |
| 7,739,092 B1 * | 6/2010 | Ballagh | G06F 17/5027 703/13 |
| 8,719,750 B1 * | 5/2014 | Balzli, Jr. | G06F 17/5072 716/113 |
| 9,218,443 B1 | 12/2015 | Styles et al. | |
| 9,590,635 B1 * | 3/2017 | Sengupta | H03K 19/17756 |
| 2012/0284501 A1 | 11/2012 | Zievers | |
| 2016/0132441 A1 | 5/2016 | Styles et al. | |

OTHER PUBLICATIONS

Koch, D. et al., "Hierarchical reconfiguration of FPGAs," in 24th Int'l. Conf. on Field Programmable Logic and Applications (FPL), Technical University of Munich (TUM), Sep. 2, 2014, pp. 1-8.

Xilinx, Inc., "Vivado Design Suite User Guide—Partial Reconfiguration," UG909 (v2018.1), Apr. 27, 2018, 84 pg.

LEDS et al., "High-Speed Expansion USB HID Host Spartan-5 XC6SLX45 CSG324C Basic I/O," [online] Atlys® FPGA Board Reference Manual, Apr. 11, 2016, DOC#: 502-178, © Digilent, Inc. retrieved from the Internet: <https://reference.digilentinc.com/_media/atlys:atlys:atlys_rm.pdf>, 19 pg.

* cited by examiner

HIERARCHICAL PARTIAL RECONFIGURATION FOR PROGRAMMABLE INTEGRATED CIRCUITS

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This disclosure relates to integrated circuits (ICs) and, more particularly, to partial reconfiguration of programmable ICs.

BACKGROUND

A programmable integrated circuit (IC) refers to a type of IC that includes programmable circuitry. An example of a programmable IC is a field programmable gate array (FPGA). An FPGA is characterized by the inclusion of programmable circuit blocks. Examples of programmable circuit blocks include, but are not limited to, input/output blocks (IOBs), configurable logic blocks (CLBs), dedicated random access memory blocks (BRAM), multipliers, digital signal processing blocks (DSPs), processors, clock managers, and delay lock loops (DLLs). Circuit designs may be physically implemented within the programmable circuitry of a programmable IC by loading a configuration bitstream into configuration memory of the programmable IC.

Partial reconfiguration is a process where a region of programmable circuitry within the programmable IC referred to as a "partial reconfiguration region" or "PR region" may be dynamically reconfigured by loading a partial configuration bitstream into the programmable IC. The partial configuration bitstream may specify different circuitry than previously implemented in the PR region. The partial configuration bitstream does not specify new and/or different circuitry for portions of programmable circuitry outside of the PR region. The PR region may undergo modification through partial reconfiguration, e.g., the loading of a partial configuration bitstream for the PR region, repeatedly where different partial configuration bitstreams specify different circuitry (or applications), while the other regions of the programmable circuitry of the programmable IC referred to as "static circuitry" or a "static region" continues to operate without interruption.

When using a circuit design with a PR region, various characteristics of the PR region remain constant. While the circuitry within a PR region may change over time using partial reconfiguration technology, the boundaries of the PR region may not be changed. As such, certain characteristics such as the size of the PR region, the shape of the PR region, the connectivity of the PR region with other circuitry, and the number of PR regions remains unchanged within the programmable IC.

SUMMARY

In one or more embodiments, a method may include converting, using computer hardware, a first partial reconfiguration module of a circuit design into a first partial reconfiguration container, wherein the circuit design is placed and routed, loading, using the computer hardware, a first netlist into the first partial reconfiguration container, wherein the first netlist includes a first plurality of partial reconfiguration modules that are initially empty, including, using the computer hardware, a further netlist within each of the first plurality of partial reconfiguration modules, and implementing, using the computer hardware, the first partial reconfiguration container and first plurality of partial reconfiguration modules within the first partial reconfiguration container.

In one or more embodiments, a method may include implementing a first circuitry within a static region of a programmable integrated circuit, the first circuitry specified by a first partial bitstream, implementing a second circuitry within a partial reconfiguration container region of the programmable integrated circuit, the second circuitry specified by a second partial bitstream, and implementing a third circuitry within a first partial reconfiguration region contained within the partial reconfiguration container region and a fourth circuitry within a second partial reconfiguration region contained within the partial reconfiguration container region, wherein the third circuitry is specified by a third partial bitstream and the fourth circuitry is specified by a fourth partial bitstream.

In one or more embodiments, an integrated circuit may include a static region including first programmable circuitry configured to implement an interface with an external device and a partial reconfiguration container region coupled to the static region that implements an interface to the static region using second programmable circuitry. The partial reconfiguration container region may include a first plurality of partial reconfiguration regions, wherein at least one of first plurality of partial reconfiguration regions is coupled to the partial reconfiguration container region.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
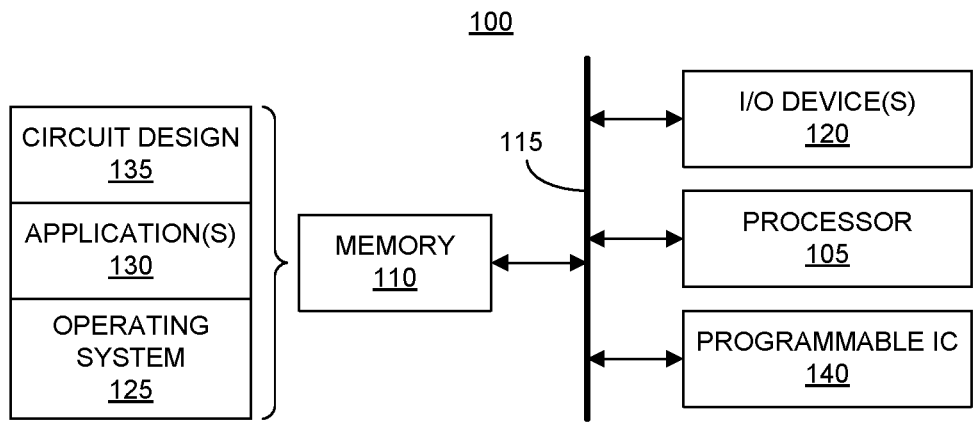
FIG. 1 illustrates an example of a data processing system for use with one or more embodiments described herein.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to partial reconfiguration of programmable ICs. In accordance with the inventive arrangements described within this disclosure, a programmable IC (also referred to herein as the "target IC") is capable of maintaining a communication link with an external system while implementing different circuitry and/or systems therein via partial reconfiguration. A static region of the programmable IC is used to implement circuitry for communicating with the external system. The static region provides support for hardware accelerated user applications and/or user specified circuitry (referred to herein as "kernels"). The kernels are implemented within a partial reconfiguration (PR) region of the programmable IC that is in communication with the static region.

In some cases, the PR region is closely associated with the static region and fixed in terms of size and boundaries. The fixed nature of the PR region, however, restricts rapid reconfiguration as is often required for particular applications such as those used within data centers. The fixed nature of the PR region also prevents fine grained parallelism where one set of kernels are able to compute continuously while another set of kernels are newly implemented within the target IC to prepare for a next set of operations.

The inventive arrangements described within this disclosure address these issues and others. For example, the inventive arrangements described within this disclosure allow Function as a Service (FaaS) users to customize a hardware acceleration platform design as needed. Using the embodiments described herein, users are able to customize the default single compute region into a fully custom platform design with multiple compute regions that are targeted and optimized for the user's specific applications. In general, FaaS is a category of cloud computing services that provides a platform allowing customers to develop, run, and manage application functionalities without the complexity of building and maintaining the infrastructure typically associated with developing and launching an application.

In addition, the example embodiments described herein are capable of reducing the number of partial configuration bitstreams (hereafter "partial bitstreams") from an "N choose M" number of partial bitstreams down to an "N×M" number of partial bitstreams, where N is the number of PR regions and M is the number of runtime functions that may be implemented in a given PR region.

In one or more embodiments, a PR container region is provided on the target IC. The PR container region may be coupled, e.g., communicatively linked, to the static region. The PR container region may include a plurality of hierarchically nested PR regions and/or PR container regions. Further, one or more of the PR regions within the PR container region may be transformed into PR container regions, where each may include a further plurality of PR regions. In this manner, PR regions may be nested within PR container regions hierarchically. This allows users to form hierarchies of PR regions within the target IC to an arbitrary depth.

In one or more other embodiments, the boundaries of the PR regions within the PR container region may be modified by loading a different PR container region into the programmable IC. Each different PR container region may include a different number of PR regions and/or different boundaries for PR regions contained therein. Still, as the different PR container regions are implemented within the target IC, the static region is capable of maintaining the communication link with the external system.

In particular embodiments, PR regions within a PR container region do not to contact or intersect with one another. The lack of overlap and/or contact by PR regions allows one PR region of a PR container region to undergo partial reconfiguration while the static circuitry and any other PR regions within the PR container region continue to operate uninterrupted. In consequence, the data throughput of the target IC is increased as some kernels are able to continue to operate while other different kernels are implemented within the target IC.

In conventional partial reconfiguration schemes, increased granularity in PR regions as provided by the example embodiments described herein is not available. This leads to situations where partial reconfiguration is performed more broadly across the target IC (e.g., using fewer and larger PR regions) than need be. In consequence, many kernels or compute units may be brought down temporarily in order to implement new and/or different kernels and/or compute units within the target IC thereby reducing data throughput or possibly halting data throughput of the target IC temporarily during the partial reconfiguration operation.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example system 100 for use with one or more embodiments described herein. System 100 is an example of computer hardware that may be used to implement a computer, a server, a portable computer such as a laptop or a tablet computer, or other data processing system. A system or device implemented using computer hardware is capable of performing the various operations described herein relating to processing a circuit design for implementation within an IC.

In the example of FIG. 1, system 100 includes at least one processor 105. Processor 105 is coupled to memory 110 through interface circuitry 115. System 100 is capable of storing computer readable instructions (also referred to as "program code") within memory 110. Memory 110 is an example of computer readable storage media. Processor 105 is capable of executing the program code accessed from memory 110 via interface circuitry 115.

Memory 110 may include one or more physical memory devices such as, for example, a local memory and a bulk storage device. Local memory refers to non-persistent memory device(s) generally used during actual execution of program code. Examples of local memory include random access memory (RAM) and/or any of the various types of RAM that are suitable for use by a processor during execution of program code (e.g., dynamic RAM or "DRAM" or static RAM or "SRAM"). A bulk storage device refers to a persistent data storage device. Examples of bulk storage devices include, but are not limited to, a hard disk drive (HDD), a solid-state drive (SSD), flash memory, a read-only memory (ROM), an erasable programmable read-only memory (EPROM), electrically erasable programmable read-only memory (EEPROM), or other suitable memory. System 100 may also include one or more cache memories (not shown) that provide temporary storage of at least some program code in order to reduce the number of times program code must be retrieved from a bulk storage device during execution.

Memory 110 is capable of storing program code and/or data. For purposes of illustration, memory 110 stores an operating system 125, one or more application(s) 130, and a circuit design 135. In one or more embodiments, application(s) 130 include an electronic design automation (EDA) application. The EDA application is capable of performing one or more operations of a design flow (e.g., synthesis, placement, routing, and/or bitstream generation) and the various operations described herein relating to implementation of circuit design 135 within a target IC and partial reconfiguration. The target IC may have an architecture the same as or similar to the architecture described in connection with FIG. 13.

System 100, e.g., processor 105, is capable of executing operating system 125 and application(s) 130 to perform the operations described within this disclosure. As such, operating system 125 and application(s) 130 may be considered an integrated part of system 100. Further, it should be appreciated that any data used, generated, and/or operated upon by system 100 (e.g., processor 105) are functional data structures that impart functionality when employed as part of the system.

Examples of interface circuitry 115 include, but are not limited to, a system bus and an input/output (I/O) bus. Interface circuitry 115 may be implemented using any of a variety of bus architectures. Examples of bus architectures may include, but are not limited to, Enhanced Industry Standard Architecture (EISA) bus, Accelerated Graphics Port (AGP), Video Electronics Standards Association (VESA) local bus, Universal Serial Bus (USB), and Peripheral Component Interconnect Express (PCIe) bus.

System 100 further may include one or more I/O devices 120 coupled to interface circuitry 115. I/O devices 120 may be coupled to system 100, e.g., interface circuitry 115, either directly or through intervening I/O controllers. Examples of I/O devices 120 include, but are not limited to, a keyboard, a display device, a pointing device, one or more communication ports, and a network adapter. A network adapter refers to circuitry that enables system 100 to become coupled to other systems, computer systems, remote printers, and/or remote storage devices through intervening private or public networks. Modems, cable modems, Ethernet cards, and wireless transceivers are examples of different types of network adapters that may be used with system 100.

System 100 may include fewer components than shown or additional components not illustrated in FIG. 1 depending upon the particular type of device and/or system that is implemented. In addition, the particular operating system, application(s), and/or I/O devices included may vary based upon system type. Further, one or more of the illustrative components may be incorporated into, or otherwise form a portion of, another component. For example, a processor may include at least some memory. System 100 may be used to implement a single computer or a plurality of networked or interconnected computers each implemented using the architecture of FIG. 1 or an architecture similar thereto.

In one or more embodiments, system 100 represents a development system (e.g., an EDA system) that is capable of processing circuit design 135 to implement partial bitstreams for implementing a static region, one or more different PR container regions, and one or more PR regions within the PR container regions. The static region implements communication circuitry within the target IC that is capable of communicating with a system external to the target IC via a communication link. For example, the static region may implement a PCIe endpoint that is capable of communicating with a host system. The PR container region is coupled to the static region. The PR container region is capable of implementing infrastructure circuitry for use by kernels, in reference to user applications (e.g., hardware accelerated user applications) and/or user specified portions of a circuit design. The kernels may be implemented within one or more PR regions contained within the PR container regions. System 100 may implement the resulting circuit designs as partial bitstreams within the target IC. Programmable IC 140 is an example of a target IC.

In one or more other embodiments, system 100 represents a runtime system, e.g., a host system, where programmable IC 140 is coupled to interface circuitry 115 and operates as a hardware accelerator. Programmable IC 140, for example, may be mounted on a circuit board that includes additional memory (e.g., RAM—not shown) that is available for use by programmable IC 140 during operation. In that case, programmable IC 140 may be loaded with partial bitstreams by processor 105 (e.g., a host processor) to implement different circuitry therein over time. Processor 105, for example, may execute an application that controls the particular partial bitstreams that are loaded in programmable IC over time and the offloading of particular tasks to kernels implemented within programmable IC 140 over time. Programmable IC 140 may provide any results back to processor 105.

System 100 allows FaaS users, for example, to customize a hardware acceleration platform design as needed. Using system 100, users are able to customize the default single compute region into a fully custom platform design with multiple compute regions that are targeted and optimized for the user's specific applications. In addition, the inventive arrangements described herein are capable of reducing the number of partial bitstreams from an "N choose M" number of partial bitstreams down to an "N×M" number of partial bitstreams for designs involving partial reconfiguration. By reducing the number of partial bitstreams that need to be generated, the inventive arrangements described within this disclosure improve the operation of the system. The runtime of the system may be significantly reduced as generation of each partial bitstream typically requires hours of computational time. By operating on circuit designs as described herein to implement hierarchical partial reconfiguration, fewer partial bitstreams are needed, which improves operation of the system.

Figure 2:
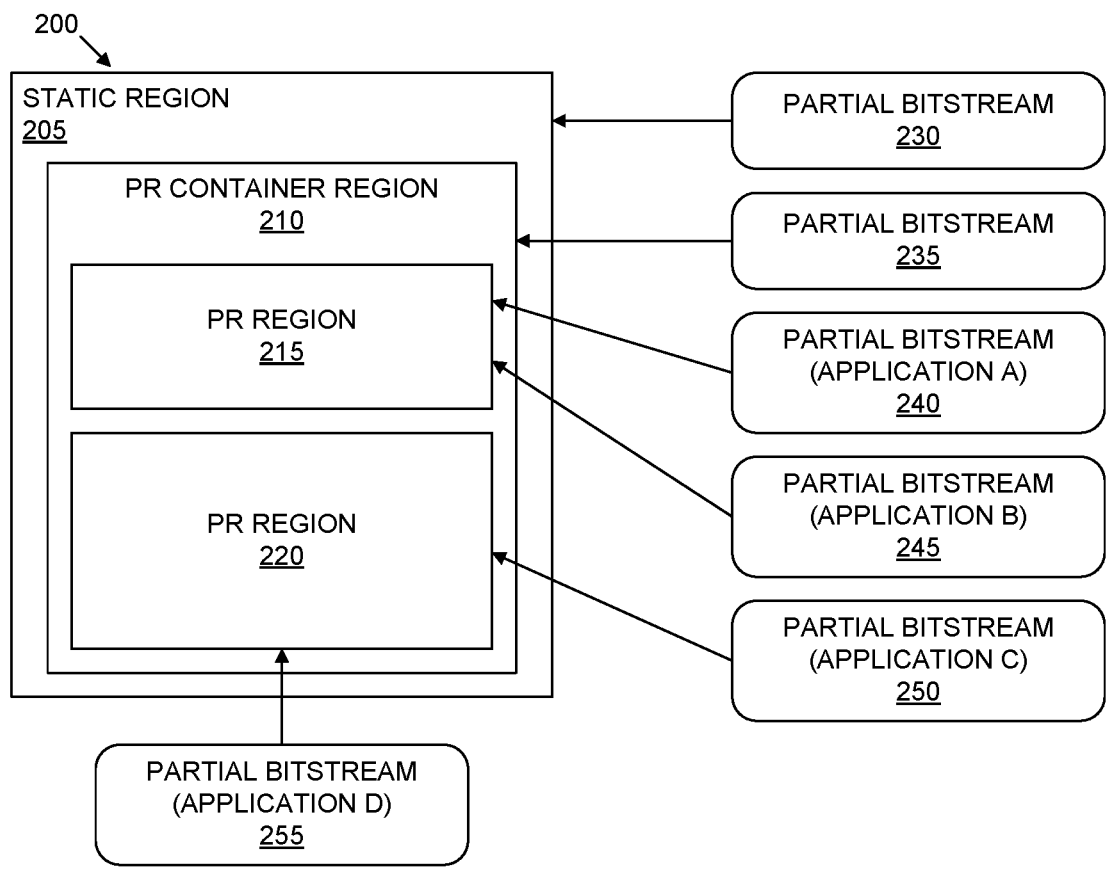
FIG. 2 illustrates an example of a programmable integrated circuit (IC).

FIG. 2 illustrates an example of a programmable IC (IC) 200. IC 200 is an example implementation of programmable IC 140 of FIG. 1. Within this disclosure, the term "region" is used to refer to physical portions or areas of a target IC. In general, the regions described herein correspond to particular modules and/or containers of a circuit design. A "PR container" refers to a logical structure of a circuit design that is capable of holding, or including, one or more PR modules and one or more PR containers. A "PR container region" refers to the region on the target IC corresponding to the PR container. As such, a PR container region may include a plurality of PR regions, where each PR region corresponds to a PR module of the circuit design. A PR region, however, may not include another PR region. Similarly, a PR module may not include any other PR modules.

In the example of FIG. 2, IC 200 includes a static region 205 and a PR container region 210. Both static region 205 and PR container region 210 are implemented using programmable circuitry of IC 200. PR container region 210 includes a plurality of user defined PR regions 215 and 220. As pictured, PR regions 215 and 220 are hierarchically ordered within PR container region 210. For example, PR regions 215 and 220 are contained completely within PR container region 210.

FIG. 2 also illustrates a plurality of partial bitstreams that may be loaded into IC 200 to implement the different regions shown. For example, partial bitstream 230 may be loaded into IC 200 to implement circuitry within static region 205. Partial bitstream 235 may be loaded into IC 200 to implement circuitry within PR container region 210.

PR region 215 is capable of implementing a plurality of different user applications each resulting in different circuitry within PR region 215. In the example of FIG. 2, PR region 215 may implement circuitry corresponding to application A by loading partial bitstream 240 or circuitry corresponding to application B by loading partial bitstream 245. PR region 220 may implement circuitry corresponding to application C by loading partial bitstream 250 or circuitry corresponding to application D by loading partial bitstream 255.

As illustrated, PR region 215 does not overlap or contact PR region 220. This allows PR region 215 to be partially reconfigured independently of PR region 220. For example, PR region 215 may implement circuitry corresponding to application A while PR region 220 implements circuitry corresponding to application C. PR region 215 may be reconfigured to implement circuitry corresponding to application B by loading partial bitstream 245 while PR region 220 continues to execute application C uninterrupted (have circuitry corresponding to application C operate uninterrupted). Similarly, regions of PR container region 210 external to PR region 215 may continue to operate uninterrupted as is the case with static region 205.

At any point, the host system, e.g., processor 105, is capable of loading a different partial bitstream within IC 200 that implements a different PR container region. The different PR container region may include a different number of PR regions than shown in FIG. 2 and/or a same number of PR regions with different boundaries thereby allowing different shapes and sizes of PR regions.

For purposes of illustration, PR region 215 and/or PR region 220 may be transformed into a PR container region. In that case, one or more PR regions may be implemented in the transformed PR container region. This process can be performed iteratively on newly created PR regions (e.g., transforming into PR container regions) in order to create a partial reconfiguration hierarchy within IC 200.

Figure 3:
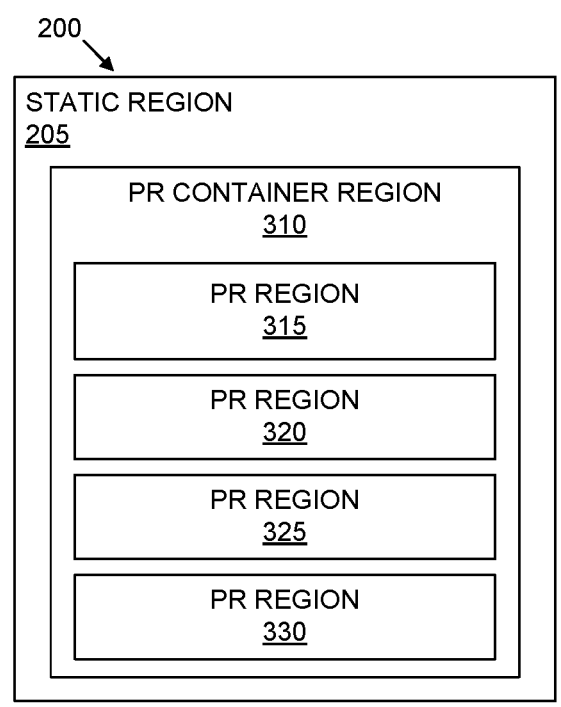
FIG. 3 illustrates another example of a programmable IC.

FIG. 3 illustrates another example of IC 200. In the example of FIG. 3, a new partial bitstream is loaded into IC 200 implementing a different PR container region 310. PR container region 310 includes four PR regions 315, 320, 325, and 330. Each of PR regions 315, 320, 325, and 330 is capable of implementing one or more different applications by loading different partial bitstreams into IC 200. FIG. 3 illustrates an example of how PR region boundaries and/or the number of PR regions may be changed within an IC.

Figure 4:
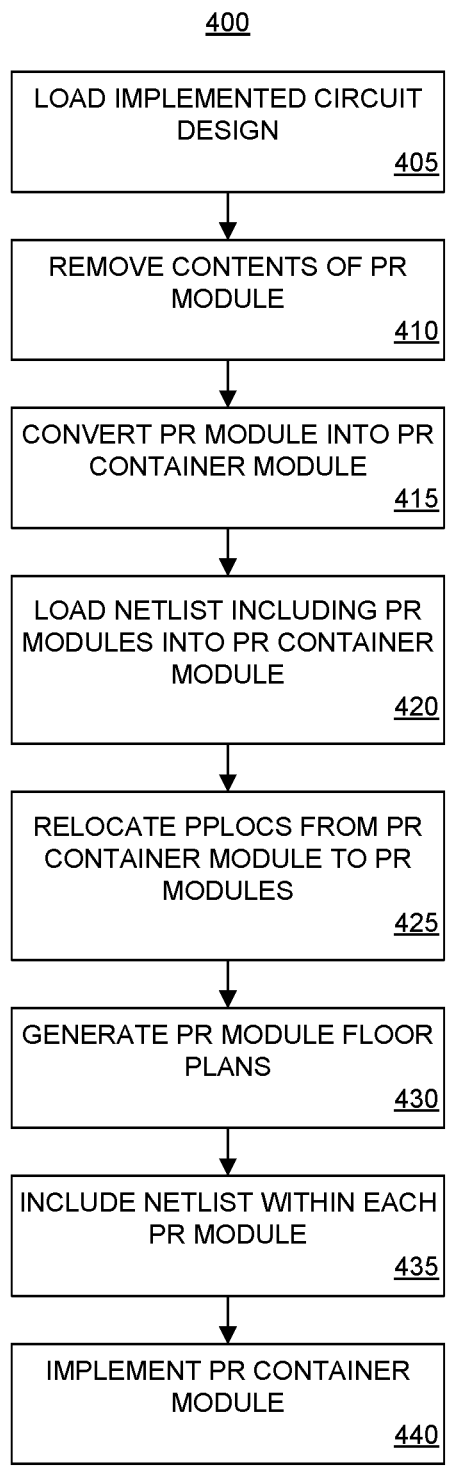
FIG. 4 illustrates an example method of hierarchical partial reconfiguration.

FIG. 4 illustrates an example method 400 of hierarchical partial reconfiguration. Method 400 may be performed by a system the same as, or similar to, system 100 described in connection with FIG. 1. Method 400 illustrates examples of subdividing PR modules of a circuit design to implement hierarchical partial reconfiguration. For purposes of illustration, method 400 is also described with reference to FIGS. 5A-5G, which provide visual illustrations of the operations performed on the circuit design.

Figure 5A:
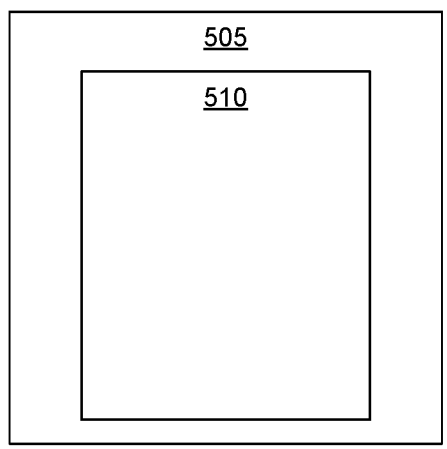
FIGS. 5A-5G illustrate example operations performed in FIG. 4.

In block 405, the system is capable of loading an implemented circuit design. The implemented circuit design is one that is placed and routed. The circuit design includes a static module 505 and a PR module 510 as shown in FIG. 5A. Static module 505 and PR module 510 are placed and routed.

Figure 5B:
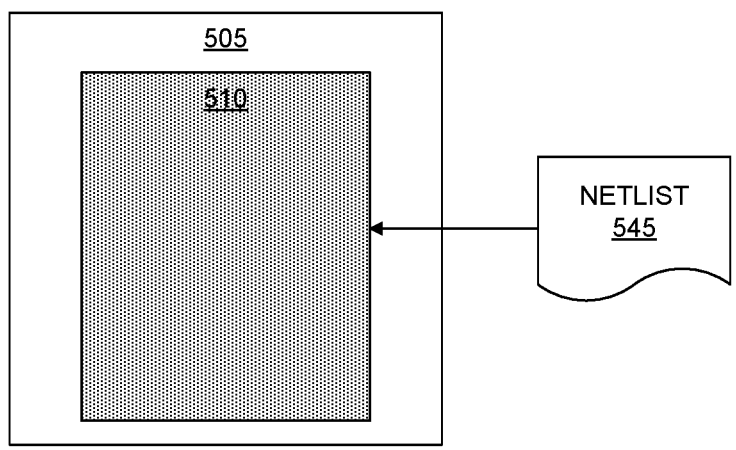

In block 410, the system is capable of removing the contents of PR module 510 as illustrated in FIG. 5B. In the example of FIG. 5B, shading of PR module 510 illustrates that system has removed the contents of PR module 510. In this regard, PR module 510 is said to be a "black box", which is an empty module, e.g., a logical module of the circuit design with no content and with "partial reconfiguration" and "module" attributes.

In block 415, the system is capable of converting PR module 510 into a PR container module 515. For example, the system changes the "module" attribute of PR module 510 to "container".

Figure 5C:
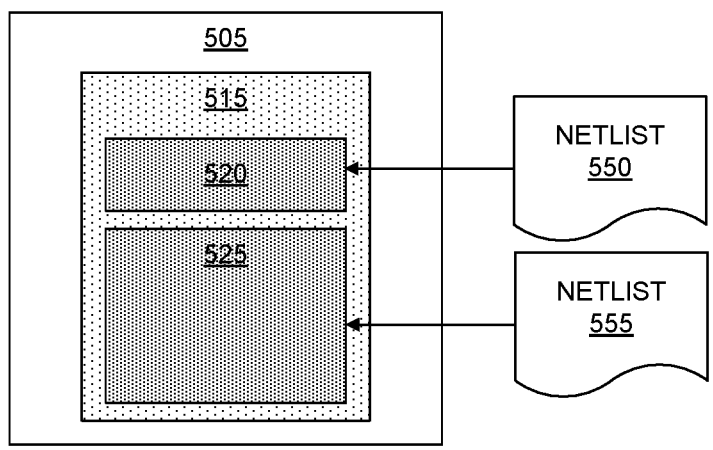

In block 420, the system is capable of loading a netlist into PR container 515. FIG. 5B illustrates a netlist 545 being included within PR container 515. The netlist that is loaded into PR container 515, e.g., netlist 545, includes two or more PR modules 520 and 525 and is illustrated in FIG. 5C. Each of PR modules 520 and 525 may be empty.

In block 425, the system is capable of relocating PPLOCs from PR container 515 to the boundaries of the appropriate ones of PR modules 520 and 525. Relocation of PPLOCs is described in greater detail in connection with FIG. 7.

In block 430, the system is capable of generating a PR module floorplan for each of PR modules 520 and 525. The PR module floorplan specifies the location constraints for each PR module. In this regard, the PR module floorplan for PR module 520 specifies the physical boundaries of PR module 520 within the target IC. In particular, the PR module floorplan for PR module 520 specifies that the physical boundaries are completely within the physical boundaries of PR container 515 (e.g., within the boundaries of a floorplan for PR container 515). It should be appreciated, that since PR module 510 was initially placed and routed, the boundaries corresponding to that module may be retained from the original circuit design loaded in block 405. As such, the floorplan of PR container 515 is available (e.g., is the same). The PR module floorplan for PR module 525 specifies that the boundaries of PR module 525 are completely within the boundaries of PR container 515. Further, the boundaries of PR module 520 and PR module 525 do not overlap or otherwise come in contact with one another.

In one or more embodiments, a user may provide one or more user inputs specifying the physical boundaries of each of PR modules 520 and 525. In particular embodiments, the system may display a graphical illustration of the region of the target IC covered by PR container 515. The user may draw a rectangle having desired dimensions and location within PR container 515 corresponding to each of PR modules 520 and 525. The system may use the user-specified input as the PR module floorplan for each respective one of PR modules 520 and 525.

In block 435, the system is capable of including a netlist within each of PR modules 520 and 525. FIG. 5C illustrates that a netlist 550 is included in PR region 520, while a netlist 555 is included in PR region 525. A user, for example, may specify a netlist that is to be included within PR module 520 and a netlist that is to be included within PR module 525. The system includes the user specified netlists within each of PR module 520 and 525.

Figure 5D:
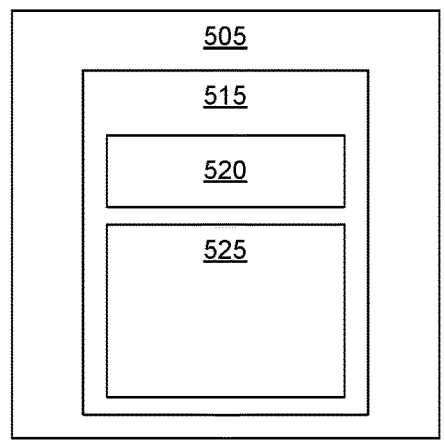

In block 440, the system is capable of implementing PR container 515. In doing so, the system is capable of implementing PR container 515 including each of PR modules 520 and 525 and the respective netlists included therein based on the respective PR module floorplans. For example, the system is capable of placing and routing circuitry corresponding to PR container 515 using the floorplan for PR container 515. The system is also capable of placing and routing each of PR modules 520 (e.g., netlist 550) and 525 (e.g., netlist 555) based upon the PR module floorplan developed for each respective one of the PR modules. FIG. 5D illustrates an example where PR container 515, including PR modules 520 and 525, is fully placed in routed.

In one or more embodiments, the system may output a partial bitstream for the PR container, a partial bitstream for PR module 520, and a partial bitstream for PR module 525. A partial bitstream for static module 505 may be available initially as the circuit design in block 405 was implemented.

To generate further partial bitstreams for different applications to be implemented within PR regions on the target IC corresponding to PR modules 520 and 525, the state of the circuit design in FIG. 5C may be stored for subsequent use. The method may be repeated from this point on by inserting different netlists into PR module 520 and/or PR module 525 and implementing each of PR modules 520 and 525 using the new and/or different netlists to generate further partial bitstreams for each of the applications.

Figure 5E:
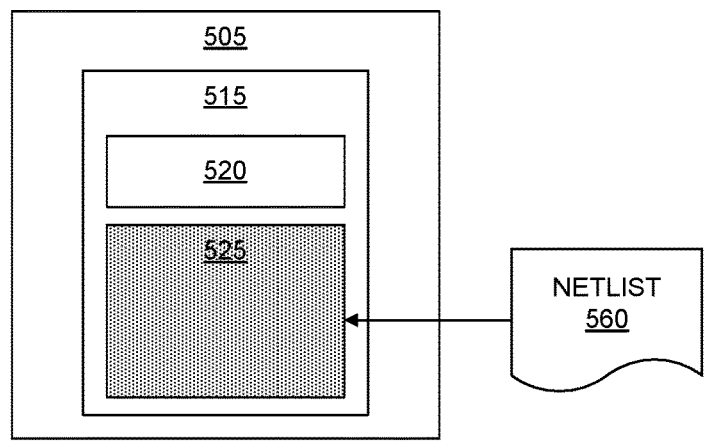
Figure 5F:
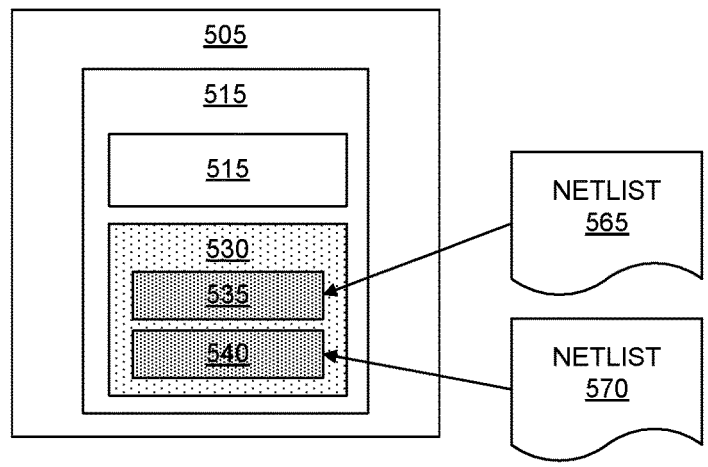
Figure 5G:
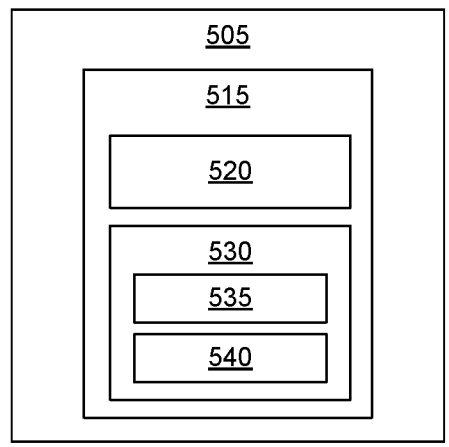

FIGS. 5E-5G illustrate additional process steps that may be performed to further subdivide PR modules. For example, the operations described in connection with method 400 may be iteratively performed so as to create further PR modules within further PR containers to an arbitrary depth. In the examples of FIGS. 5E-5G, PR module 525 is transformed into a PR container 530 that includes further PR modules 535 and 540.

Referring to the example of FIG. 5E, the system is capable of generating a PR container 530 by removing contents of PR module 525, changing the parameter of PR module 525 to that of "container", and loading a netlist 560 therein that includes a plurality of PR modules 535 and 540 into PR container 530 as illustrated in FIG. 5F. Each of PR modules 535 and 540 may be empty. In the example of FIG. 5E, shading of PR module 525 illustrates that system has removed the contents of PR module 525. In this regard, PR module 525 is said to be a black box. In the example of FIG. 5F, netlist 560 is included in what is now PR container 530. The system may include a netlist 565 into PR module 535 and a netlist 570 into PR module 540. The system may then implement, e.g., place and route, PR container 530. The system may then implement PR container 530 including PR modules 535 and 540 as shown in FIG. 5G.

As discussed, the hierarchy of PR containers and PR modules may continue to an arbitrary depth. Further, the number of PR modules included in any given PR container may be more than 2. A user, for example, may initiate the operations described using an EDA system to convert any PR module into a PR container capable of including a plurality of PR modules and iterate the process to the desired level of partial reconfiguration hierarchy.

Figure 6:
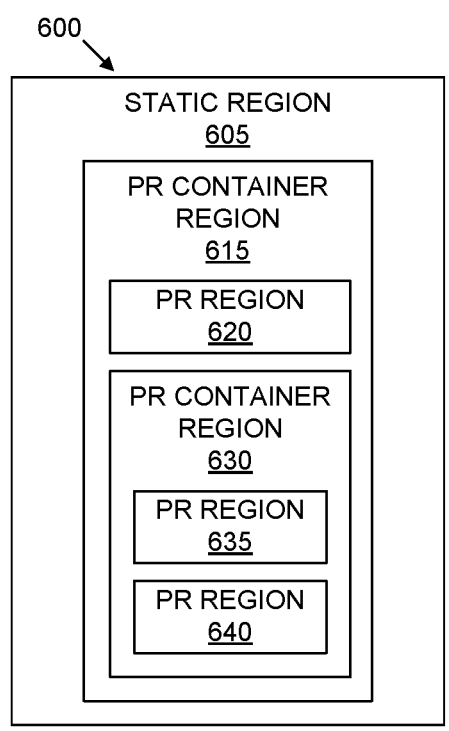
FIG. 6 illustrates an example IC implementing the circuit design of FIG. 5G.

FIG. 6 illustrates an example IC 600 implementing the circuit design of FIG. 5G. FIGS. 5A-5G illustrate logical illustrates of the state of the circuit design while also trying to illustrate the physical relationship to the target IC. FIG. 6 illustrates the physical regions implemented in IC 600 from the placed and routed circuit design illustrated in FIG. 5G. As pictured, IC 600 includes a static region 605 corresponding to static module 505. As discussed, static region 605 may implement communication circuitry capable of maintaining a communication link with an external system such as a host processor over a communication bus. IC 600 also includes a PR container region 615. In general, PR container region 615 illustrates the physical region on IC 600 implementing PR container 515.

PR container region 615 includes a PR region 620 and a PR container region 630. PR region 620 illustrates the physical region on IC 600 implementing PR module 520. PR container region 630 illustrates the physical region on IC 600 implementing PR container 530. PR container region 630 includes PR region 635 and PR region 640. PR regions 635 and 640 are physical regions on IC implementing PR modules 535 and 540, respectively.

In the example of FIG. 6, different partial bitstreams may be loaded into IC 600 and any time during operation to implement different circuitry within any one of PR region 620, 635 and/or 640. Each of PR region 620, 635, and/or 640 may be reconfigured independently of the others under control of the host system. In another example, an entirely new implementation of PR region 630 may be implemented within an IC 600 at any time while PR region 620 and PR container region 615 continue to operate uninterrupted. The new implementation of PR region 630 may include PR regions of different boundaries than those illustrated for PR regions 635 and 640 and/or a different number of PR regions than shown for PR container region 630 altogether. In still another example, an entirely new version of PR container region 615 may be implemented that has an architecture entirely different than that shown in FIG. 6.

The example of FIG. 6 is intended to illustrate independence among different PR regions and that one or more PR regions may be dynamically reconfigured to implement different kernels while kernels of other PR regions continue to operate within IC 600 uninterrupted. This allows data throughput of IC 600 to remain high with selected kernels continuing to operate while other kernels are implemented in circuitry within IC 600 to perform different tasks. The example of FIG. 6 further illustrates that users, at the application level, are capable of controlling and changing boundaries between different PR regions as may be required. In general, user applications may create any hierarchy of PR container regions and PR regions needed for a given application so long as the hierarchy may be implemented within available portions of IC 600 not included within static region 605.

Figure 7:
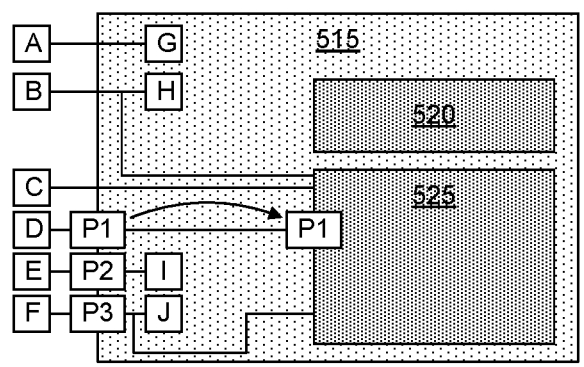
FIG. 7 illustrates an example of PPLOC handling.

FIG. 7 illustrates an example of PPLOC handling. A PPLOC refers to a partition pin with a parameter indicating that the partition pin is locked and may not be moved. Partition pins define signal crossings between a static module (static region) and a PR module (a PR region) or between PR modules (PR regions). PPLOC handling may be performed as part of the creation of reconfiguration modules as described in connection with block 425 of FIG. 4.

FIG. 7 illustrates how PPLOCs are handled with respect to partitions (e.g., module boundaries) in the circuit design. For purposes of illustration, PPLOCs are illustrated for PR container 515 and PR module 525 only. Further PPLOCs may exist for nets connecting to PR module 520 that are not shown, but may be handled in the same or similar manner.

In general, the system categories connections that cross the boundary of PR container 515 into two different categories. The first category includes connections that do not have a PPLOC parameter. The second category includes connections that do have a PPLOC parameter. In the example of FIG. 7, cell A (e.g., a circuit block) connects to cell G. Cell B connects to cell H and to PR module 525. Cell C connects to PR module 525. The connections A-G, B-H, and C-PR module 525 belong to the first category of connections. For connections within the first category, the system takes no action.

For connections within the second category, the system selectively relocates the PPLOCs. Relocating a PPLOC refers to removing the "lock" attribute from a partition pin and adding the "lock" attribute to another, different partition pin. For the connection involving cell D, the system relocates PPLOC P1 from a partition pin on the boundary of PR container 515 to a partition pin on the boundary of PR region 525. The system relocates PPLOC P1 because cell D (1) has a PPLOC located on the boundary of PR container 525 and is not connected to any other cell within PR container 515 that is external to PR modules 520 and 525.

For the connection involving cell E and cell I, the system does not move PPLOC P2 despite being located on the boundary of PR container 525 since the E-I connection does not involve PR module 525 or PR module 520. For the connection F-J, the system does not move the PPLOC P3 despite being located on the boundary for PR container 515 since cell J is not directly connected to PR module 520 or PR module 525. The connection to PR module 525 occurs after PPLOC P3 and is within PR container 515.

Figure 8:
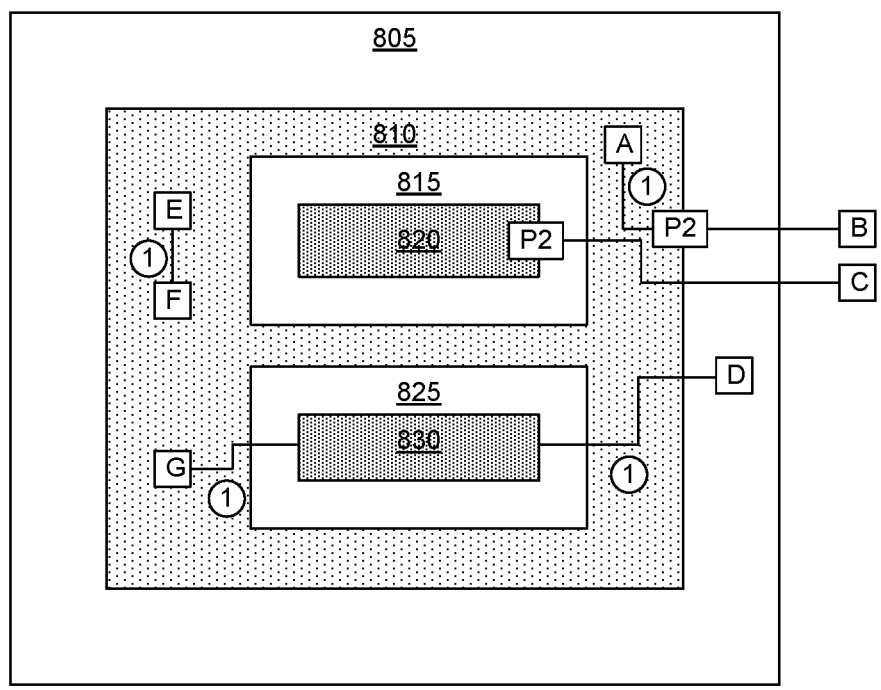
FIG. 8 illustrates an example technique for placement and routing.

FIG. 8 illustrates an example technique for placement and routing. The technique illustrated in FIG. 8 may be used in implementing PR container 515 as part of block 440 of FIG. 4. In the example of FIG. 8, a PR container region 810 includes a PR region 820 and a PR region 830. In placing circuit elements of a PR container corresponding to PR container region 810, the system is restricted to placing such circuit elements anywhere within PR container region 810 excluding PR regions 820 and 825, per the floorplan for PR container region 810. When routing connections for cells within PR container region 810, the system is permitted to use an expanded area represented by expanded region 805. Each expanded area may extend a predetermined distance from the underlying area being expanded (e.g., PR container region 810 in this example).

Each of the connections labeled with the 1 enclosed in a circle are connections that must be routed using only wires located within expanded region 805. As such, when routing the connection between cells E and F, the connection between cell G and PR region 830, the connection between PR region 830 and cell D, and the connection between cell A and PPLOC P2, the system is constrained to using only those routing resources (e.g., wires) included an expanded region 805.

Similarly, when placing circuit elements of PR modules corresponding to PR regions 820 and 830, the system is constrained to placing the circuit elements within PR regions 820 and 830, respectively based upon the PR module floorplans of each PR region. For any connections between cells located within PR region 820, the system is constrained to using only those routing resources located within expanded region 815. For any connections between cells located within PR region 830, the system is constrained to using only those routing resources located within expanded region 825.

As described, using the example embodiments described herein, a designer is capable of creating hierarchies of PR container regions and PR regions as may be desired. This allows new and/or different kernels to be implemented in certain PR regions while kernels implemented in other PR regions are able to continue operating uninterrupted. This may be performed with any desired level of granularity. In cases where the designer no longer needs one or more levels of partial reconfiguration hierarchy, PR regions may be recombined to reduce the levels of hierarchy within the circuit design.

Figure 9:
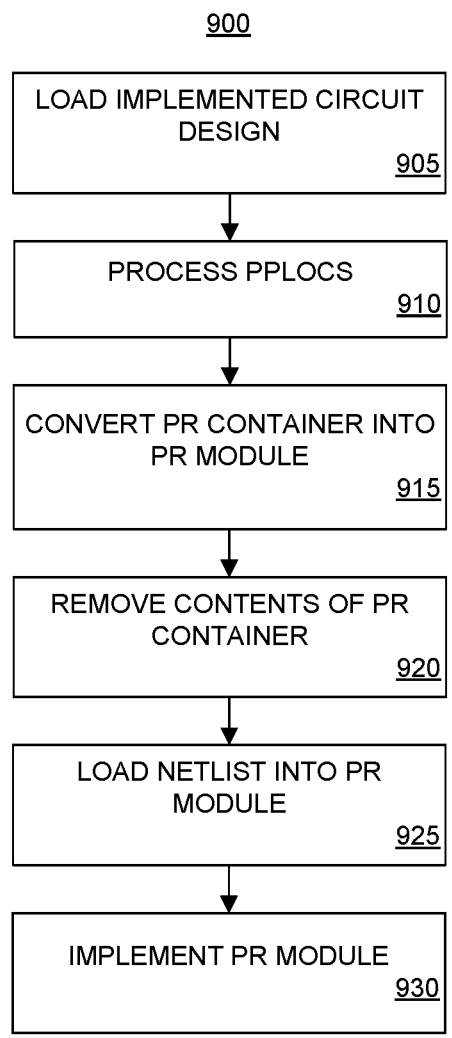
FIG. 9 illustrates another example method of hierarchical partial reconfiguration.

FIG. 9 illustrates another example method 900 of hierarchical partial reconfiguration. More particularly, whereas FIG. 4 illustrates creating additional hierarchy, method 900 is directed to reducing the amount of partial reconfiguration hierarchy within a circuit design. Method 900 may be performed by a system the same as, or similar to, system 100 described in connection with FIG. 1. Method 900 illustrates examples of recombining PR modules of a circuit design thereby reducing the amount of hierarchical partial reconfiguration used. For purposes of illustration, method 900 is also described with reference to FIGS. 10A-10E, which provide visual illustrations of the operations performed on the circuit design.

Figure 10A:
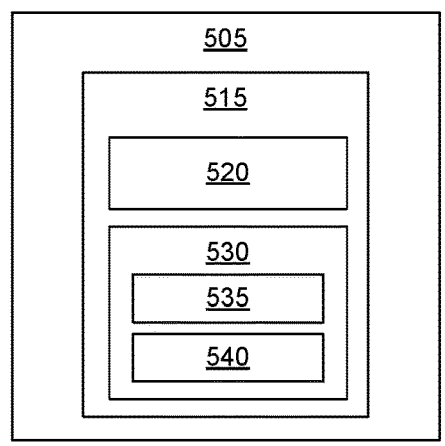
FIGS. 10A-10E illustrate example operations performed in FIG. 9.

In block 905, the system is capable of loading an implemented circuit design. The implemented circuit design is one that is placed and routed and includes a partial reconfiguration hierarchy. As shown in FIG. 10A, the circuit design includes a static module 505, PR container 515, a PR module 520, PR container 530, and PR modules 535 and 540. The circuit design illustrated in FIG. 10A, for purposes of illustration, is the circuit design originally described in connection with FIG. 5G. Each of the modules and containers described are placed and routed.

In block 910, the system is capable of performing PPLOC processing. In block 910, the system is capable of removing selected PPLOCs from PR container 530 and moving other selected PPLOCs from boundaries of PR modules to the boundary of PR container 530. PPLOC handling for purposes of recombining levels of partial reconfiguration hierarchy is described in greater detail in connection with FIG. 11.

In block 915, the system is capable of converting PR container 530 into PR module 525. For example, the system changes the attribute associated with PR container 530 from "container" to "module". The transformation of PR container 530 to PR module 525 is at least partially illustrated in FIG. 10B. In block 920, the system is capable of removing the contents of PR module 525. Removal of the contents turns PR module 525 into a black box. The shading of FIG. 10 B illustrates the black box nature of PR module 525.

Figure 10B:
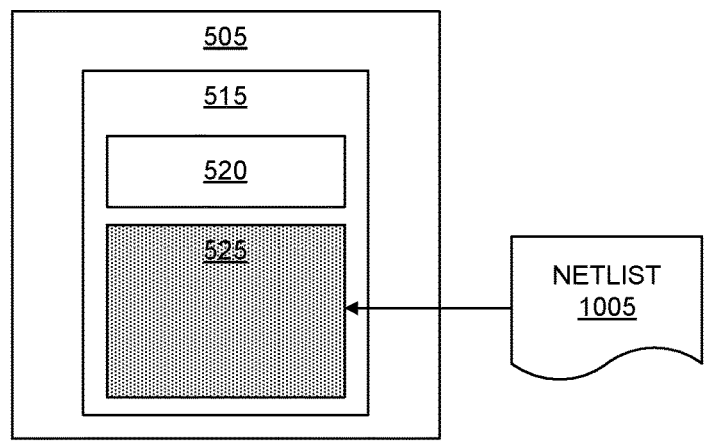

In block 925, the system is capable of loading a netlist into PR module 525. The system may load a netlist 1005, as shown in FIG. 10B, into PR module 525. The netlist that is loaded into PR module 525, e.g., netlist 1005, may be a standard netlist and that does not include any PR modules.

Figure 10C:
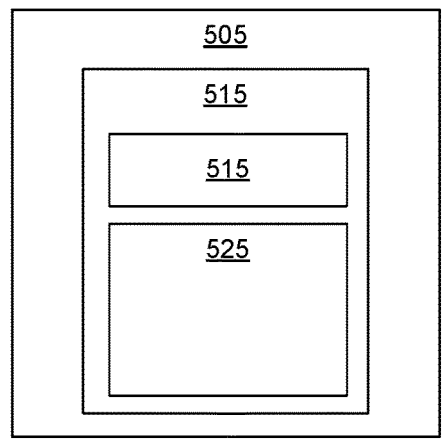

In block 930, the system is capable of implementing PR module 525. The system, for example, is capable of placing and routing the netlist included in PR module 525. A floorplan for PR module 525 may be stored from the prior generation of the partial reconfiguration hierarchy described in connection with FIG. 4. The floorplan for PR module 525 may be used in implementing netlist 1005 loaded therein. FIG. 10C illustrates an example where PR module 525 is placed and routed. The system may generate and output a partial bitstream for PR module 525. Further, the system may generate further partial bitstreams for other applications by loading different netlists into the black-boxed version of PR module 525 and then implementing such netlists as described.

In the example of FIG. 9, PR container 530 was selected for processing. It should be appreciated that a partial reconfiguration hierarchy with more levels than illustrated in FIG. 10 may be processed and that a user may select any reconfiguration container within that hierarchy for processing as described in connection with FIG. 9. The processing effectively eliminates the PR modules of the PR container and transforms the PR container into a PR module.

Figure 10D:
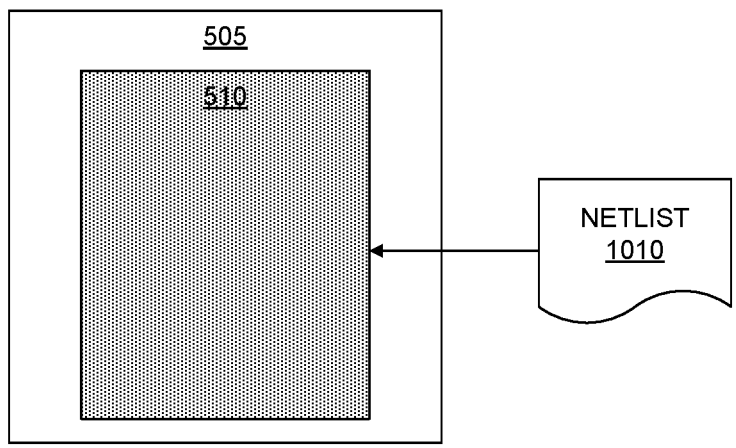
Figure 10E:
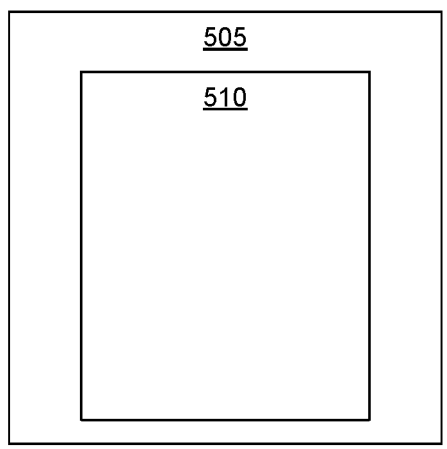

For purposes of illustration, FIGS. 10D and 10E illustrate further processing where PR container 515 may be processed. In the example of FIG. 10D, the system may perform PPLOC processing. The system further may remove the contents of PR container 515 leaving a black box implementation of PR container 515. The system may then change the parameter of PR container 515 from "container" to "module" thereby transforming PR container 515 into PR module 510. The system may then add a netlist 1010 to the black box version of PR module 510.

The system may then implement PR module 510. As such, PR module 510 is placed in routed. Further, the system may generate and/or output a partial bitstream for PR module 510. In implementing PR module 510, the system may use the floorplan for PR module 510 as generated during the process described in connection with FIG. 4.

As discussed, the hierarchy of PR containers and PR modules may continue to an arbitrary depth. A user may implement a recombine process to reduce the number of levels of partial reconfiguration hierarchy from any selected PR container within the hierarchy. For example, PR container 515 may be initially selected instead of PR container 530 for purposes of illustration in describing FIG. 9.

Figure 11:
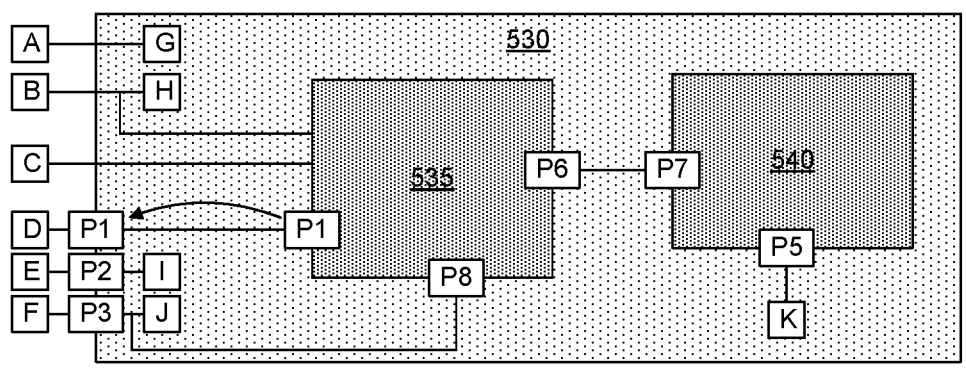
FIG. 11 illustrates another example of PPLOC processing.

FIG. 11 illustrates another example of PPLOC processing. More particularly, FIG. 11 illustrates PPLOC processing for recombining levels of a partial reconfiguration hierarchy. The PPLOC processing illustrated in FIG. 11 may be performed by the system in implementing block 910 of FIG. 9. For purposes of illustration, PPLOCs are illustrated for PR container 530, PR module 535, and PR module 540.

In general, the system categories connections that cross the boundary of PR container 530 or that are within PR container 530 into two different categories. The first category includes connections that do not have a PPLOC parameter. The second category includes connections that do have a PPLOC parameter. In the example of FIG. 11, cell A (e.g., a circuit block) connects to cell G. Cell B connects to cell H and to PR module 535. Cell C connects to PR module 535. The connections A-G, B-H, and C-PR module 535 belong to the first category of connections. For connections within the first category, the system takes no action.

For connections within the second category, the system selectively removes and/or relocates the PPLOCs. For the connection involving cell D, the system relocates PPLOC P1 from a partition pin on the boundary of PR module 535 to a partition pin on the boundary of PR container 530. In general, the system relocates PPLOCs from PR modules being removed from the circuit design up one level within the hierarchy to the parent PR container. The system relocates PPLOC P1 because cell D has a PPLOC located on the boundary of PR module 535 and is not connected to any other cell within PR container 530 that is external to PR modules 535 and 540.

For the connection involving cell E and cell I, the system does not move PPLOC P2 because PPLOC P2 is already located on the boundary of PR container 530 and connection E-I does not involve PR module 535 or PR module 540. For the connection F-J, the system does not move PPLOC P3 since PPLOC P3 is already located on the boundary of PR container 530 and since cell J is not directly connected to PR module 535 or PR module 540.

For PPLOCs located on a boundary of a PR module being removed from the circuit design and that has not been moved as described in connection with PPLOC P1, the system removes such PPLOCs. For example, the system removes PPLOCs P6 and P7 since these PPLOCs are located on boundaries of PR modules being removed from the circuit design and are in a connection between the two PR modules being removed from the circuit design. The system also removes PPLOCs located on a boundary of a PR module being removed that does not connect to a cell located outside of the parent PR container. For example, the system removes PPLOC P5 since PPLOC P5 is in the connection to cell K, which is located in PR container 530. The system also removes PPLOC P8 since PPLOC P8 is on the boundary of PR module 535 and the other end of the connection goes to another PPLOC P3 on the boundary of PR container 530.

For purposes of placement and routing, the system may use placement and routing techniques as described in connection with FIG. 8. For example, referring to FIGS. 10B and 10C, when placing netlist 1005, the system may place components of netlist 1005 within a PR region corresponding to PR module 525. When routing PR module 525, the system may use routing resources located within a region that extends beyond the PR region corresponding to PR module 525. Similarly, the system may place components of netlist 1010 within the PR region corresponding to PR module 510. The system may use routing resources located within a region that extends beyond the PR region corresponding to PR module 510 when routing netlist 1010.

Figure 12:
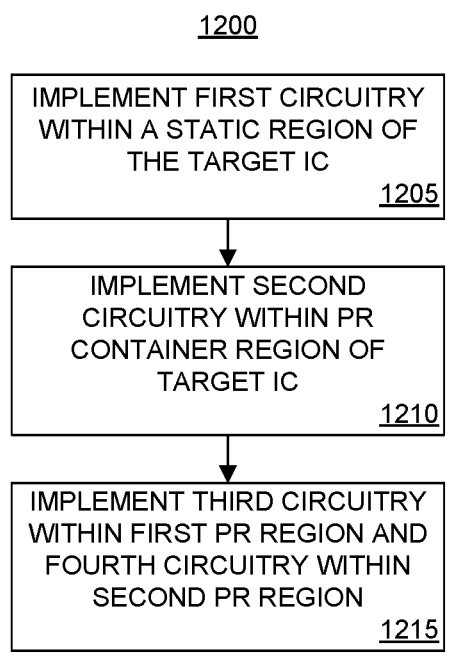
FIG. 12 illustrates an example method of implementing circuitry within an IC.

FIG. 12 illustrates an example method 1200 of implementing circuitry within an IC. Method 1200 may be performed by a host system, e.g., processor 105 of FIG. 1, to implement hierarchical partial reconfiguration within a target IC. More particularly, method 1200 may be performed by a host system using a target IC as a hardware accelerator to implement different regions of circuitry as described herein during runtime. The implementation of the various regions described in connection with FIG. 12 may be performed using partial reconfiguration of the target IC by loading partial bitstreams therein under control of the host system.

In block 1205, the host system is capable of implementing a first circuitry within a static region of a target IC. The first circuitry may be specified by a first partial bitstream loaded into the target IC. In block 1210, the host system is capable of implementing a second circuitry within a PR container region of the target IC. The second circuitry may be specified by a second partial bitstream loaded into the target IC.

In block 1215, the host system is capable of implementing a third circuitry within a first PR region contained within the PR container region and a fourth circuitry within a second PR region contained within the PR container region. The third circuitry may be specified by a third partial bitstream that is loaded into the target IC. The fourth circuitry may be specified by a fourth partial bitstream that is loaded into the target IC.

The host system may perform further operations such as implementing different circuitry within either one or both of the PR regions while the while the first circuitry, the second circuitry, and the fourth circuitry continue to operate uninterrupted.

The host system may also load further partial bitstreams to implement an entirely different PR container region in the target IC that includes one or more different PR regions therein. The host may implement different circuitry within each respective PR region by loading a different partial bitstream into the target IC.

Figure 13:
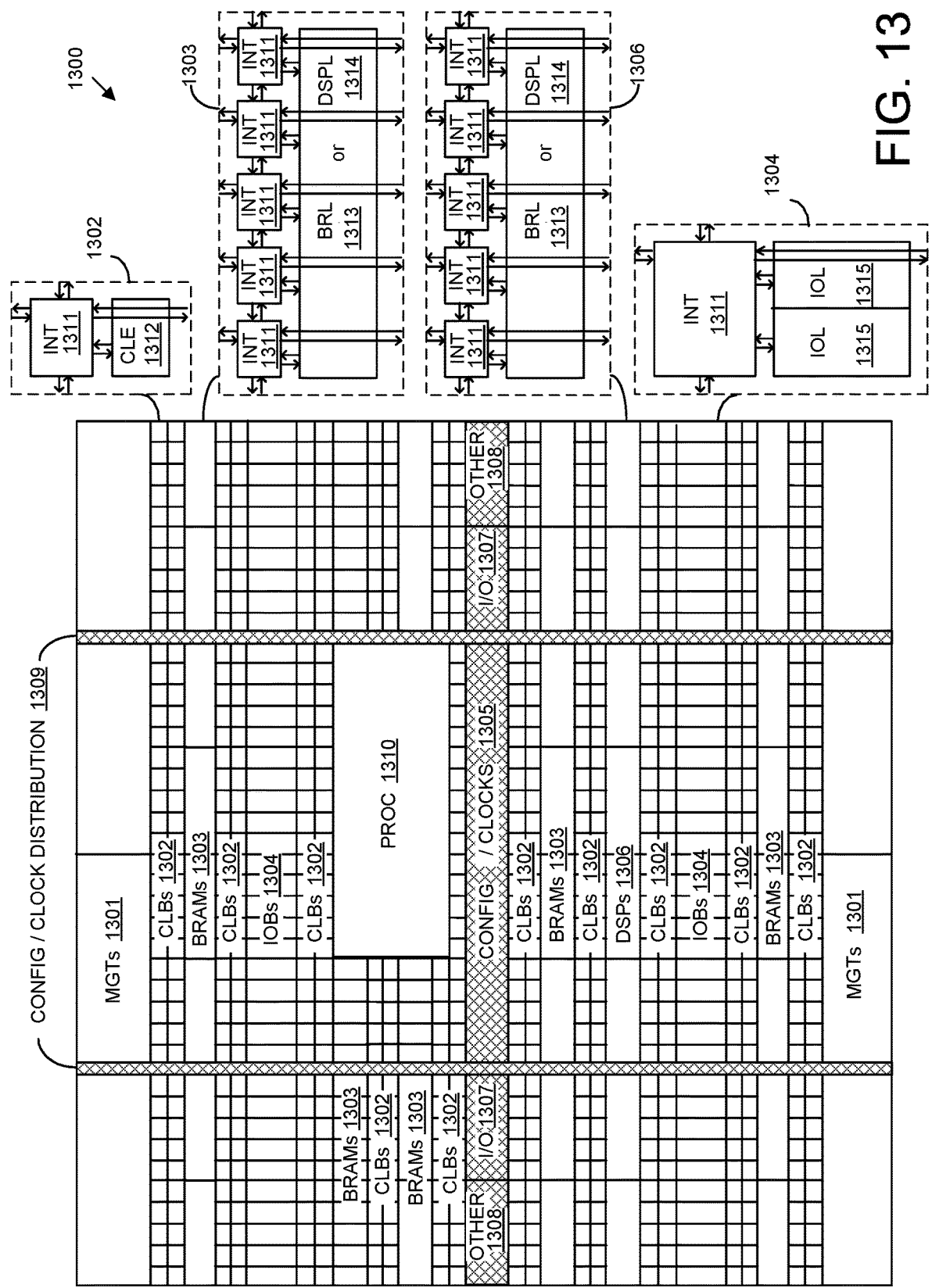
FIG. 13 illustrates an example architecture for an IC.

FIG. 13 illustrates an example architecture 1300 for an IC. In one aspect, architecture 1300 may be implemented within a programmable IC. For example, architecture 1300 may be used to implement a field programmable gate array (FPGA). Architecture 1300 may also be representative of a system-on-chip (SOC) type of IC. An SOC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 1300 includes several different types of programmable circuit, e.g., logic, blocks. For example, architecture 1300 may include a large number of different programmable tiles including multi-gigabit transceivers (MGTs) 1301, configurable logic blocks (CLBs) 1302, random access memory blocks (BRAMs) 1303, input/output blocks (IOBs) 1304, configuration and clocking logic (CONFIG/CLOCKS) 1305, digital signal processing blocks (DSPs) 1306, specialized I/O blocks 1307 (e.g., configuration ports and clock ports), and other programmable logic 1308 such as digital clock managers, analog-to-digital converters, system monitoring logic, and so forth.

In some ICs, each programmable tile includes a programmable interconnect element (INT) 1311 having standardized connections to and from a corresponding INT 1311 in each adjacent tile. Therefore, INTs 1311, taken together, implement the programmable interconnect structure for the illustrated IC. Each INT 1311 also includes the connections to and from the programmable logic element within the same tile, as shown by the examples included at the top of FIG. 13.

For example, a CLB 1302 may include a configurable logic element (CLE) 1312 that may be programmed to implement user logic plus a single INT 1311. A BRAM 1303 may include a BRAM logic element (BRL) 1313 in addition to one or more INTs 1311. Typically, the number of INTs 1311 included in a tile depends on the height of the tile. As pictured, a BRAM tile has the same height as five CLBs, but other numbers (e.g., four) also may be used. A DSP tile 1306 may include a DSP logic element (DSPL) 1314 in addition to an appropriate number of INTs 1311. An IOB 1304 may include, for example, two instances of an I/O logic element (IOL) 1315 in addition to one instance of an INT 1311. The actual I/O pads connected to IOL 1315 may not be confined to the area of IOL 1315.

In the example pictured in FIG. 13, a columnar area near the center of the die, e.g., formed of regions 1305, 1307, and 1308, may be used for configuration, clock, and other control logic. Horizontal areas 1309 extending from this column may be used to distribute the clocks and configuration signals across the breadth of the programmable IC.

Some ICs utilizing the architecture illustrated in FIG. 13 include additional logic blocks that disrupt the regular columnar structure making up a large part of the IC. The additional logic blocks may be programmable blocks and/or dedicated circuitry. For example, a processor block depicted as PROC 1310 spans several columns of CLBs and BRAMs.

In one aspect, PROC 1310 may be implemented as dedicated circuitry, e.g., as a hardwired processor, that is fabricated as part of the die that implements the programmable circuitry of the IC. PROC 1310 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 1310 may be omitted from architecture 1300 and replaced with one or more of the other varieties of the programmable blocks described. Further, such blocks may be utilized to form a "soft processor" in that the various blocks of programmable circuitry may be used to form a processor that can execute program code as is the case with PROC 1310.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 13 that are external to PROC 1310 such as CLBs 1302 and BRAMs 1303 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 1310.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SOC, the configuration bitstream may specify the circuitry that is to be implemented within the programmable circuitry and the program code that is to be executed by PROC 1310 or a soft processor. In some cases, architecture 1300 includes a dedicated configuration processor that loads the configuration bitstream to the appropriate configuration memory and/or processor memory. The dedicated configuration processor does not execute user-specified program code. In other cases, architecture 1300 may utilize PROC 1310 to receive the configuration bitstream, load the configuration bitstream into appropriate configuration memory, and/or extract program code for execution.

FIG. 13 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 13 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 1310 within the IC are for purposes of illustration only and are not intended as limitations.

A system as described in connection with FIG. 1, for example, is capable of further processing a circuit design having undergone the processing described herein for implementation within an IC having an architecture the same as or similar to that of FIG. 13. The system, for example, is capable of synthesizing, placing, and routing the circuit design. The system may also create a partial reconfiguration hierarchy to a specified or arbitrary depth and/or perform recombining to reduce the levels of partial reconfiguration hierarchy. The system may generate appropriate bitstreams, e.g., partial bitstreams, so that the bitstreams may be loaded into the IC, thereby physically implementing the circuit design, including any level of partial reconfiguration hierarchy specified, within the IC.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without user intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," "one or more embodiments," "particular embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," "in particular embodiments," and similar language throughout this disclosure may, but do not necessarily, all refer to the same embodiment. The terms "embodiment" and "arrangement" are used interchangeably within this disclosure.

As defined herein, the term "processor" means at least one hardware circuit. The hardware circuit may be configured to carry out instructions contained in program code. The hardware circuit may be an integrated circuit. Examples of a processor include, but are not limited to, a central processing unit (CPU), an array processor, a vector processor, a digital signal processor (DSP), an FPGA, a programmable logic array (PLA), an ASIC, programmable logic circuitry, and a controller.

As defined herein, the term "output" means storing in physical memory elements, e.g., devices, writing to display or other peripheral output device, sending or transmitting to another system, exporting, or the like.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

In one or more embodiments, a method may include converting, using computer hardware, a first partial reconfiguration module of a circuit design into a first partial reconfiguration container, wherein the circuit design is placed and routed, loading, using the computer hardware, a first netlist into the first partial reconfiguration container, wherein the first netlist includes a first plurality of partial reconfiguration modules that are initially empty, including, using the computer hardware, a further netlist within each of the first plurality of partial reconfiguration modules, and implementing, using the computer hardware, the first partial reconfiguration container and first plurality of partial reconfiguration modules within the first partial reconfiguration container.

In one aspect, the method may include generating, for each of the first plurality of partial reconfiguration modules, a first partial reconfiguration module floorplan. Each first partial reconfiguration module floorplan is contained within a floorplan of the first partial reconfiguration container and is used to implement respective ones of the first plurality of partial reconfiguration modules.

In another aspect, the implementing the first partial reconfiguration container may include placing and routing the first partial reconfiguration container and each of the first plurality of partial reconfiguration modules so that circuit elements of each of the first plurality of partial reconfiguration modules is located within a boundary specified by each respective first partial reconfiguration module floorplan.

In another aspect, the converting may include emptying contents of the first partial reconfiguration module prior to the loading the first netlist.

In another aspect, the method may include moving a partition pin of a connection to a selected one of the first plurality of partial reconfiguration modules from a boundary of the first partial reconfiguration container to a boundary of the selected one of the first plurality of partial reconfiguration modules.

In another aspect, the method may include receiving user input specifying boundaries for the first plurality of partial reconfiguration modules.

In another aspect, the method may include, for at least one selected partial reconfiguration module of the first plurality of partial reconfiguration modules, converting the at least one selected partial reconfiguration module into a second partial reconfiguration container and implementing a second plurality of partial reconfiguration modules within the second partial reconfiguration container.

In one or more embodiments, a method may include implementing a first circuitry within a static region of a programmable integrated circuit, the first circuitry specified by a first partial bitstream, implementing a second circuitry within a partial reconfiguration container region of the programmable integrated circuit, the second circuitry specified by a second partial bitstream, and implementing a third circuitry within a first partial reconfiguration region contained within the partial reconfiguration container region and a fourth circuitry within a second partial reconfiguration region contained within the partial reconfiguration container region, wherein the third circuitry is specified by a third partial bitstream and the fourth circuitry is specified by a fourth partial bitstream.

In one aspect, the method may include implementing a fifth circuitry within the first partial reconfiguration region while the first circuitry, the second circuitry, and the fourth circuitry continue to operate uninterrupted. The fifth circuitry may replace the third circuitry.

In another aspect, the fifth circuitry is specified by a fifth partial bitstream.

In another aspect, the method may include implementing a fifth circuitry within the first partial reconfiguration region and implementing a sixth circuitry within the second partial reconfiguration region while the first circuitry and the second circuitry continue to operate uninterrupted. The fifth circuitry may replace the third circuitry and the sixth circuitry may replace the fourth circuitry.

In another aspect, the fifth circuitry may be specified by a fifth partial bitstream and the sixth circuitry may be specified by a sixth partial bitstream.

In another aspect, the method may include implementing a fifth circuitry within the partial reconfiguration container region of the programmable integrated circuit, where the fifth circuitry is specified by a fifth partial bitstream. The method may also include implementing, within the partial reconfiguration container region, a sixth circuitry within a third partial reconfiguration region and a seventh circuitry within a fourth partial reconfiguration region, wherein the sixth circuitry is specified by a sixth partial bitstream and the seventh circuitry is specified by a seventh partial bitstream.

In one or more embodiments, an integrated circuit may include a static region including first programmable circuitry configured to implement an interface with an external device and a partial reconfiguration container region coupled to the static region that implements an interface to the static region using second programmable circuitry. The partial reconfiguration container region may include a first plurality of partial reconfiguration regions, wherein at least one of first plurality of partial reconfiguration regions is coupled to the partial reconfiguration container region.

In one aspect, circuitry within a selected partial reconfiguration region of the first plurality of partial reconfiguration regions is changed during operation of the integrated circuit while the static region and the partial reconfiguration container region continue to operate uninterrupted.

In another aspect, circuitry within each of the first plurality of partial reconfiguration regions is changed during operation of the integrated circuit while the static region and partial reconfiguration container region continue to operate uninterrupted.

In another aspect, a number of the first plurality of partial reconfiguration regions is user-specified.

In another aspect, boundaries of the first plurality of partial reconfiguration regions are user-specified.

In another aspect, the partial reconfiguration container region includes a further partial reconfiguration container region including a second plurality of partial reconfiguration regions.

In another aspect, each partial reconfiguration region of the first plurality of partial reconfiguration regions and each partial reconfiguration region of the second plurality of partial reconfiguration regions is independently reconfigurable.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method, comprising:

converting, using computer hardware, a first partial reconfiguration module of a circuit design into a first partial reconfiguration container, wherein the circuit design is placed and routed;

loading, using the computer hardware, a first netlist into the first partial reconfiguration container, wherein the first netlist includes a first plurality of partial reconfiguration modules that are initially empty;

including, using the computer hardware, a further netlist within each of the first plurality of partial reconfiguration modules; and implementing, using the computer hardware, the first partial reconfiguration container and first plurality of partial reconfiguration modules within the first partial reconfiguration container.

2. The method of claim 1, further comprising:

generating, for each of the first plurality of partial reconfiguration modules, a first partial reconfiguration module floorplan;

wherein each first partial reconfiguration module floorplan is contained within a floorplan of the first partial reconfiguration container and is used to implement respective ones of the first plurality of partial reconfiguration modules.

3. The method of claim 2, wherein the implementing the first partial reconfiguration container comprises:

placing and routing the first partial reconfiguration container and each of the first plurality of partial reconfiguration modules so that circuit elements of each of the first plurality of partial reconfiguration modules is located within a boundary specified by each respective first partial reconfiguration module floorplan.

4. The method of claim 1, wherein the converting comprises:

emptying contents of the first partial reconfiguration module prior to the loading the first netlist.

5. The method of claim 1, further comprising:

moving a partition pin of a connection to a selected one of the first plurality of partial reconfiguration modules from a boundary of the first partial reconfiguration container to a boundary of the selected one of the first plurality of partial reconfiguration modules.

6. The method of claim 1, further comprising:

receiving user input specifying boundaries for the first plurality of partial reconfiguration modules.

7. The method of claim 1, further comprising:

for at least one selected partial reconfiguration module of the first plurality of partial reconfiguration modules, converting the at least one selected partial reconfiguration module into a second partial reconfiguration container and implementing a second plurality of partial reconfiguration modules within the second partial reconfiguration container.

* * * * *